United States Patent [19]
Pathak et al.

[11] Patent Number: 6,115,305
[45] Date of Patent: Sep. 5, 2000

[54] METHOD AND APPARATUS FOR TESTING A VIDEO DISPLAY CHIP

[75] Inventors: Saroj Pathak, Los Altos Hills; James E. Payne, Boulder Creek; Glen A. Rosendale, Palo Alto; Nianglamching Hangzo, San Jose, all of Calif.

[73] Assignee: Atmel Corporation, San Jose, Calif.

[21] Appl. No.: 09/333,805

[22] Filed: Jun. 15, 1999

[51] Int. Cl.⁷ .................................................. G11C 7/00
[52] U.S. Cl. ...................... 365/201; 365/230.06; 365/231
[58] Field of Search .............................. 365/201, 230.06, 365/231, 230.08, 189.08

[56] References Cited

U.S. PATENT DOCUMENTS

| | | | |
|---|---|---|---|
| 4,654,827 | 3/1987 | Childers | 365/201 |
| 5,392,248 | 2/1995 | Truong et al. | 365/201 |
| 5,555,522 | 9/1996 | Anami et al. | 365/200 |
| 5,682,389 | 10/1997 | Nizaka | 371/21.1 |
| 5,684,809 | 11/1997 | Stave et al. | 371/27 |

*Primary Examiner*—David Nelms
*Assistant Examiner*—Thong Le
*Attorney, Agent, or Firm*—Thomas Schneck

[57] ABSTRACT

A video chip includes test circuitry for detecting opens and shorts. The circuitry includes a series-connected chain of transistors and a test register. There is a circuit for the column lines and for the row lines. A bit pattern is driven onto the column or the row lines and received in the corresponding test circuitry. The pattern is read out and compared against the input pattern to detect faulty lines.

20 Claims, 4 Drawing Sheets

METHOD AND APPARATUS FOR TESTING A VIDEO DISPLAY CHIP

TECHNICAL FIELD OF THE INVENTION

The present relates generally to video display chips and more specifically to a method and apparatus for testing video display chips.

BACKGROUND ART

A video chip typically comprises a matrix of pixels consisting of a storage capacitor and a pass transistor. Data stored in the various capacitors collectively comprise a video image. The stored image is "read" out by shining a light on the chip and visually scanning the image.

This mode of outputting the stored contents poses a problem in the manufacture of such chips. Testing a video chip is not possible until the chip is packaged so that it is functional as an imaging device. This permits a test image to be loaded into the device and then visually inspected for defects. Defective devices can then be identified, removed from the lot and discarded. Thus, a defect is not detected until the chip is fully packaged. This is a costly process because the manufacturing cost has already been invested in producing the packaged part, which has now been determined to be defective.

It is therefore desirable to have the capability of screening out defective video chips prior to their being packaged in a final form. What is needed is a scheme for providing a suite of tests to the chip to fully verify the operability of the device before final packaging of the device.

SUMMARY OF THE INVENTION

A method for testing a video chip comprising a plurality of signal lines arranged in matrix form in accordance with the invention includes applying a voltage potential to one end of the signal lines, driving the gates of a series-connected chain of transistor with the other end of the signal lines, applying a voltage at one end of the transistor chain, and detecting a potential at the other end of the transistor chain. The method further includes loading an input bit pattern at one end of the signal lines and detecting the pattern which forms at the other end of the signal lines. By comparing the input pattern against the detected pattern various defects in the signal lines can be detected.

A video chip in accordance with the present invention includes a matrix of video storage elements, a column selector for loading a row of a video image into a selected row in the matrix, a row selector for selecting a row in the matrix. The video chip further includes a column test register disposed opposite the column selector so that the column lines are connected therebetween. Similarly, a row test register is disposed opposite the row selector so that the row lines are connected therebetween.

The column selector includes register for receiving an input test pattern and means for driving the test pattern onto the column lines. The column test registers receive a pattern at the other end of the column lines whereby defects in the column lines can be determined by comparing the input test pattern against the pattern stored in the column test register.

The row selector includes registers for receiving an input test pattern and means for driving the test pattern onto the row lines. The row test registers receive a pattern at the other end of the row lines whereby defects in the row lines can be determined by comparing the input test pattern against the pattern stored in the row test registers. dr

BEST MODE FOR CARRYING OUT THE INVENTION

Figure 1:
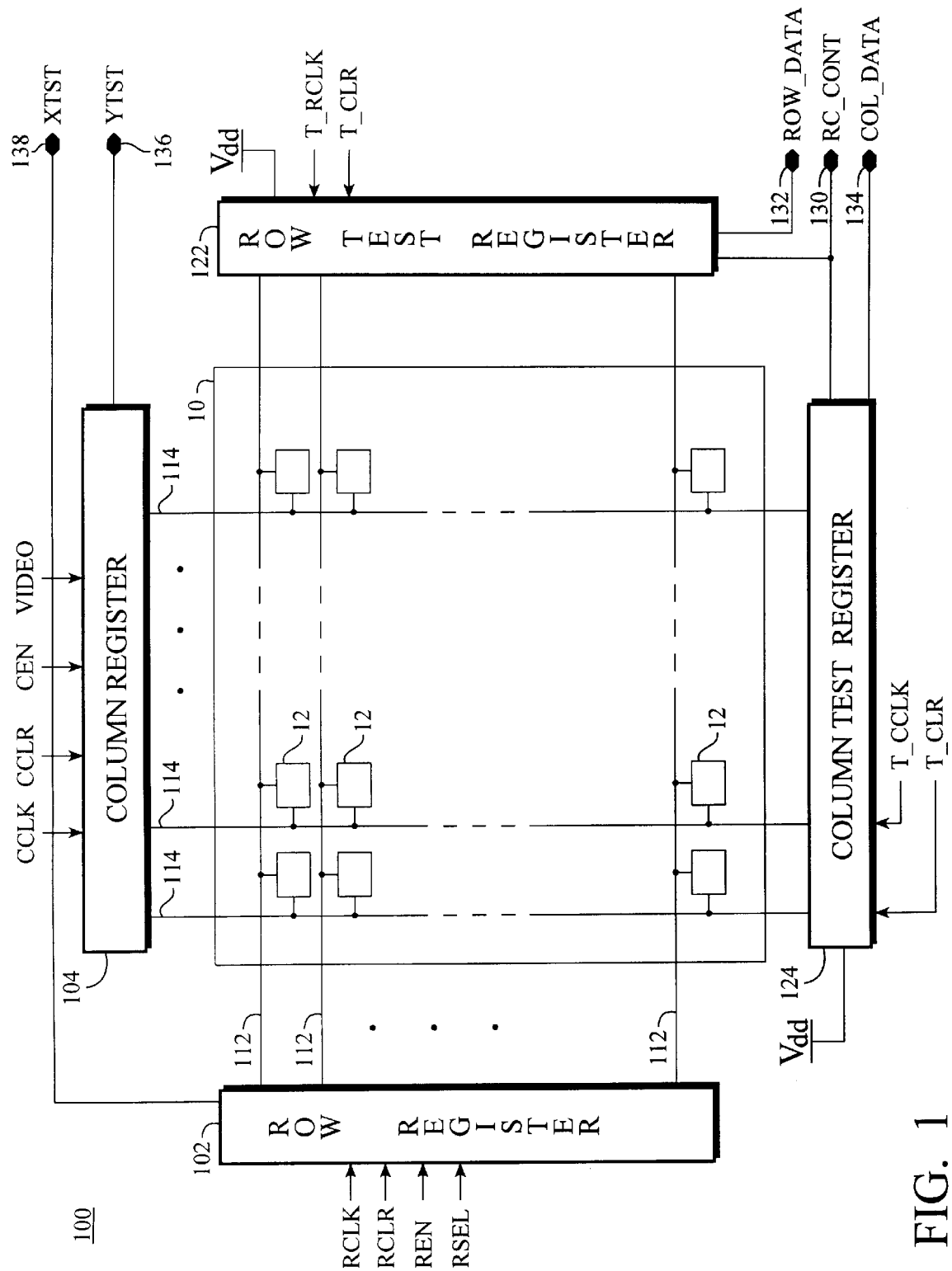
FIG. 1 is a block diagram of a video chip of the present invention.
Figure 6:
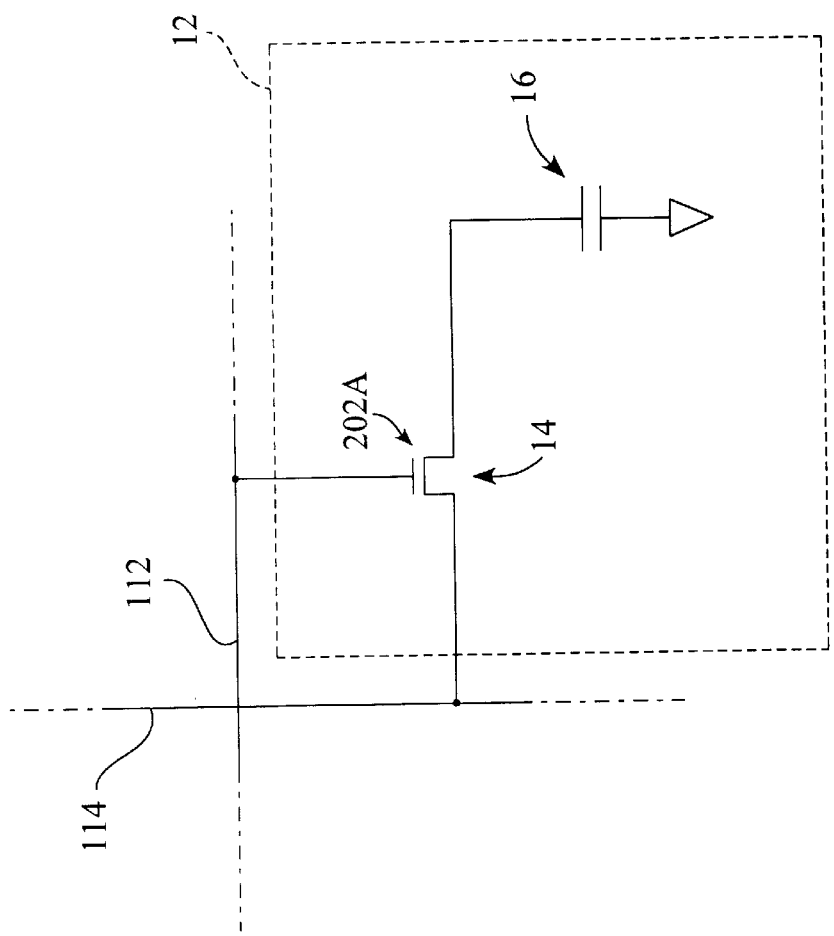
FIG. 6 shows a typical storage cell.

Referring to FIG. 1, a video chip 100 comprises a matrix 10 of storage elements 12 arranged in row and column order. A typical storage element is shown in FIG. 6, comprising a pass transistor 14 coupled to deliver a charge to a capacitor 16. Each storage element 12 has an associated column (data) line 114 and a row (word) select line 112. Typically, a scan line of a video signal is received by a column register 104 which then drives the signal onto each of column lines 114. A primary row select register 102 drives a control signal onto a selected one of row lines 112 so that the video signal carried by column lines 114 is transferred through pass transistors 14 into capacitors 16 comprising the storage elements of the selected row.

The column register 104 of the present invention includes a test input 136 for receiving a column test signal YTST. Column test signal YTST comprises a bit pattern that is serially shifted in via clock signal CCLK. Similarly, row register 102 includes a test input 138 for receiving a row test signal XTST (also a pattern of bits), which clocked in via clock signal RCLK.

Figure 4:
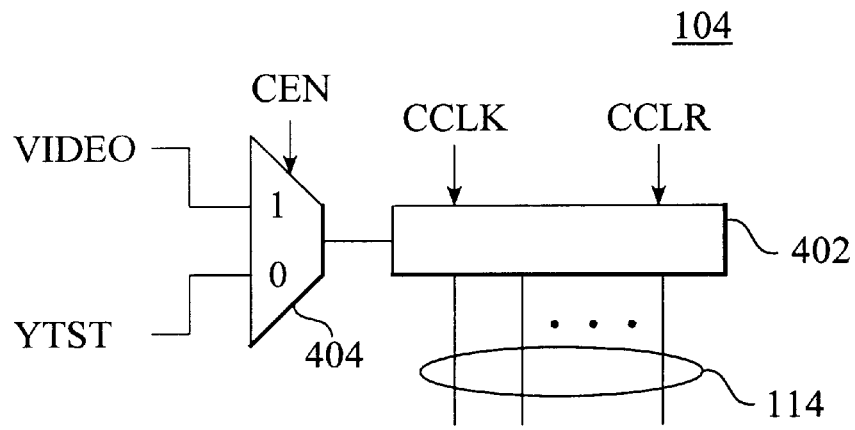
FIGS. 4 and 5 are block diagrams of the column and row registers shown in FIG. 1.
Figure 5:
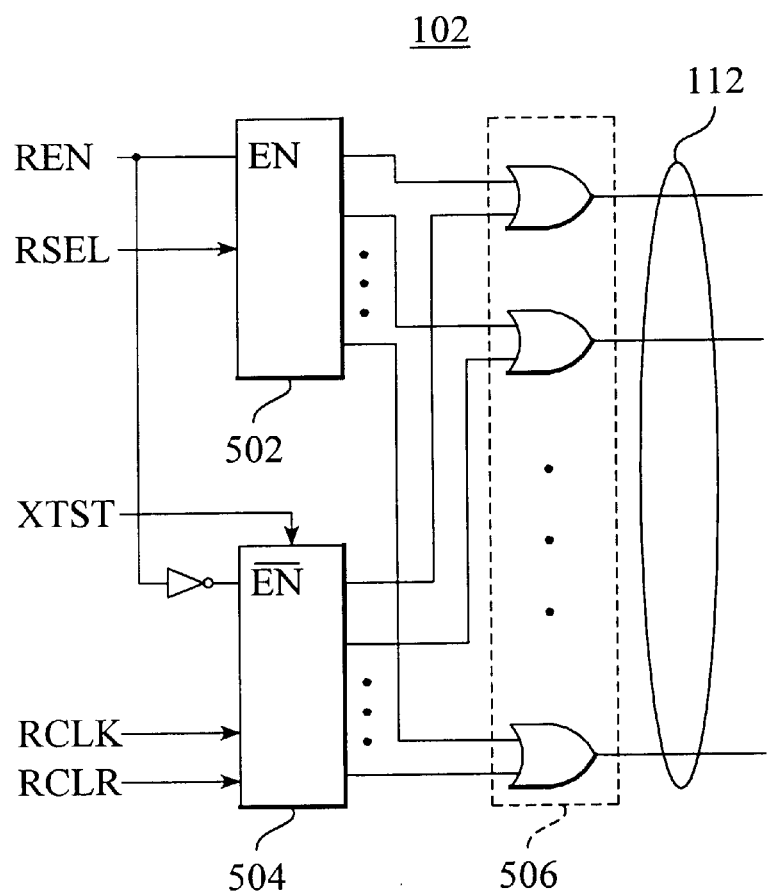

Turn for a moment to the block diagrams for column and row registers 104 and 102 shown in FIGS. 4 and 5. As shown in FIG. 4, column register 104 comprises a register bank 402, the outputs of which constitute column lines 114. Signal CCLK serially clocks data from a mux 404 into register bank 402. Mux 404 is coupled to receive as input video scan line VIDEO and test data YTST. Depending on column enable signal CEN, either the video signal or the test signal will be serially shifted into register bank 402. As shown in FIG. 4, asserting column enable signal CEN puts column register 104 in video output mode, while test mode is entered by de-asserting CEN.

FIG. 5 shows that row register 102 consists of a decoder 502 and a register bank 504, each of whose outputs are OR'd together by OR gates 506. The outputs of the OR gates constitute row lines 112. Decoder 502 includes an active-hi enable input while register bank 504 includes an active-lo enable input. Thus, either the decoder or the register bank is enabled at any one time by row enable signal REN so that row lines 112 carry only one set of signals. Video mode is selected by asserting enable signal REN, while test mode is selected by de-asserting REN. In video mode, decoder 502 receives select signal RSEL to energize the row line associated with the current scan line. In test mode, as will be explained below, the row lines 112 each is driven with a logic one or a logic zero. This is achieved by serially clocking in a test pattern into register bank 504 from XTST under the control of clock signal RCLK and de-asserting enable signal REN.

Returning to FIG. 1, it can be seen that the far ends of each of column lines 114 and row lines 112 respectively feed into a column test register 124 and a row test register 122. Both test registers 122 and 124 have an input for receiving a voltage potential Vdd. Column test register 124 receives a clock signal T_CCLK and a register clear signal T_CLR. Likewise, row test register 122 receives a clock signal T_RCLK and the same register clear signal T_CLR. It is noted that the row test register can be cleared by its own register clear signal. However, it is typical that both test registers will be cleared at the same time and so a single clear signal is sufficient.

Each test register 122 and 124 is provided with two outputs. A continuity output RC_CONT from each test register is coupled to a single test node 130. Column test register 124 includes a serial output 134, while row test register 122 is provided with serial output 132. Although the preferred embodiment shows that the continuity outputs of the test registers are tied to node 130, this is not necessary. The single node 130 is preferred since it is contemplated that row and column continuity tests (explained below) will be performed separately. Also, a single output node is preferred since it minimizes the pin-count of the device.

Figure 2:
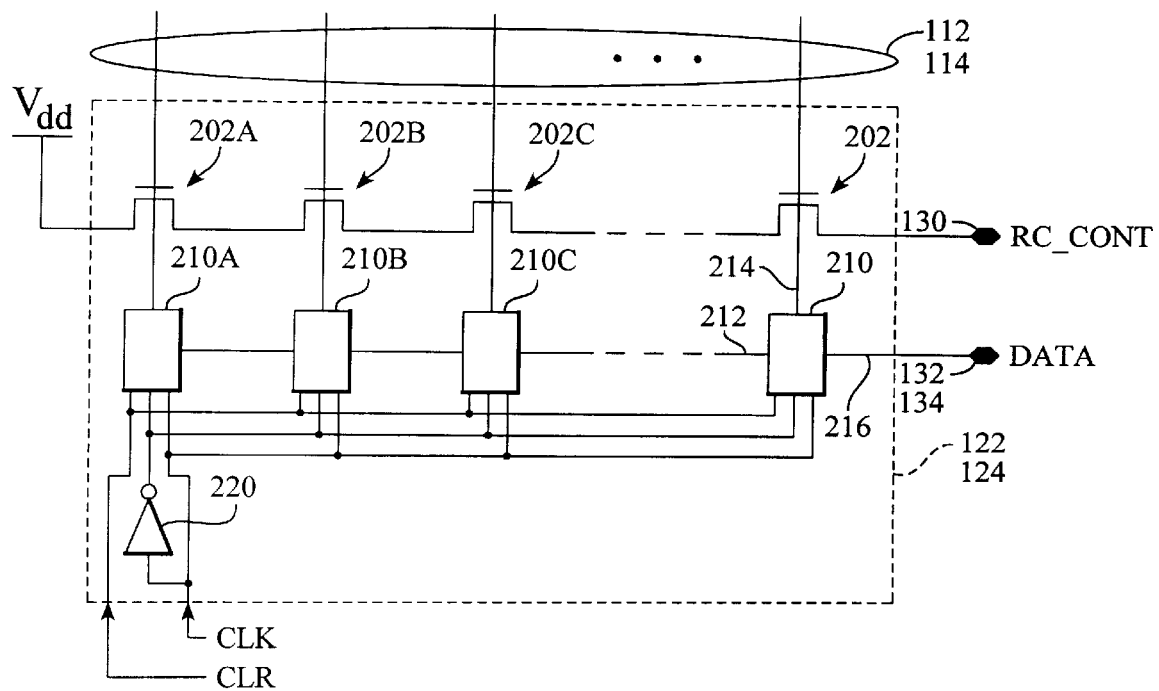
FIG. 2 is a block diagram of the test registers shown in FIG. 1.

Referring to FIG. 2, it can be seen that each of the test registers 122 and 124 includes a series-connected chain of transistors 202. A first end of the transistor chain is coupled to Vdd and a second end is coupled to node 130. FIG. 2 shows the use of N-channel transistors, although P-channel devices can be used. The source terminal of a previous transistor 202B is coupled to the drain terminal of a subsequent transistor 202C. The gate of each transistor 202 is coupled to the far end of a column (data) line 114 in the case of column test register 124 or a row (word) line 112 in the case of row test register 122.

It is also clear from FIG. 2 that the column and word lines 114 and 112 in each test register 124 and 122 additionally feed into a bank of series-connected flip-flop circuits 210. These flip-flop circuits together constitute the register portion of test registers 122 and 124. Each flip-flop circuit 210 is provided with two inputs: a first input 214 for receiving either a column or a row line 124 and 122; and a second input 212 being coupled to the output 216 of a previous flip-flop circuit. Each flip-flop circuit also receives a clocking signal CLK; T_CCLK in the case of column test register 124 and T_RCLK for row test register 122. In addition, a complement of the clock signal is provided via inverter 220. Finally, an input is provided for a CLR signal to reset each flip-flop circuit. The output 216 of the last flip-flop circuit in the register bank is coupled to node 132 in the case of row test register 122 and to node 134 in the case of column test register 124.

Figure 3:
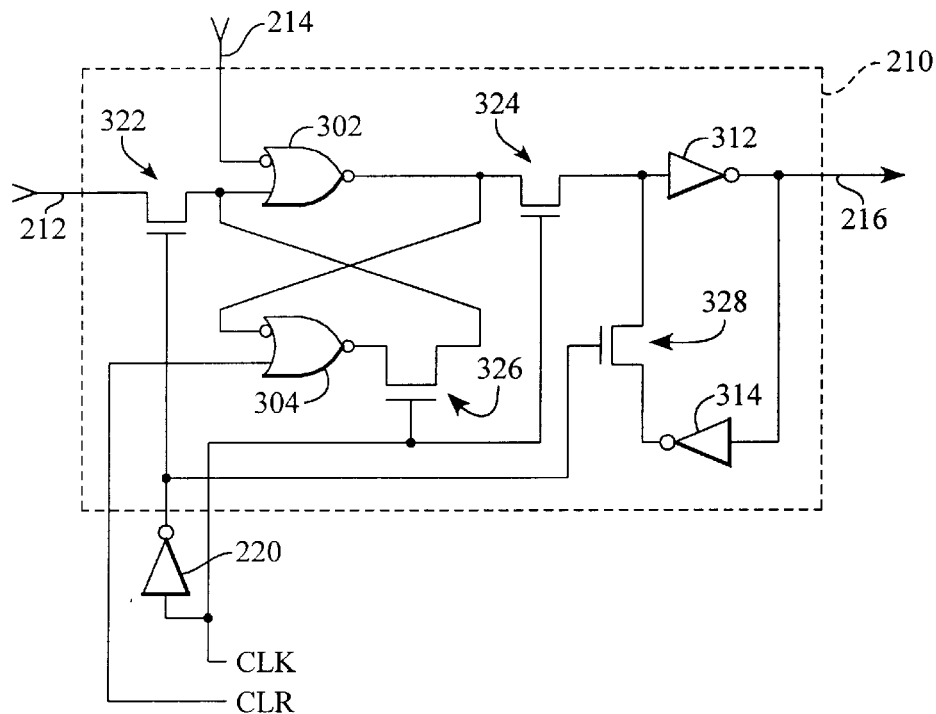
FIG. 3 is a block diagram of the shift registers shown in FIG. 2.

Referring now to FIG. 3, the flip-flop circuits of the present invention each consists of a pair of NOR gates 302 and 304. The NOR gates are cross-coupled, the output of gate 302 being coupled to an inverted input of gate 304 and the output of gate 304 being coupled to a non-inverted input of gate 302 through pass transistor 326. An inverted input of gate 302 receives first input 214, which will either be a column line or a row line, while its non-inverted input is coupled to second input 212 through pass transistor 322. A non-inverted input of gate 304 receives the CLR signal to reset the flip-flop circuit.

The output of gate 302 is coupled to a latch circuit through pass transistor 324. The latch circuit is comprised of inverters 312 and 314 coupled in a feedback configuration through pass transistor 328. The output of inverter 312 is coupled to output 216 of the flip-flop circuit. Pass transistors 326 and 324 are turned on by positive edges of the clock signal, while pass transistor 322 and 328 are turned on by negative going edges of the clock.

The discussion will now turn to the method of testing the column and row lines in accordance with the invention. Consider a continuity test of column lines 114. With reference to FIG. 1, a pattern of bits is serially shifted into column register 104 via test input 136, one bit for each column line. In the case of a continuity test, the bit pattern is simply all ones. Next, the pattern is output onto column lines 114, thus transferring the bit pattern into column test register 124. The potential at node 130 is monitored. Referring to FIG. 2, it can be seen that initially the transistors 202 comprising the transistor chain in column test register 124 are all turned off. The potential at node 130 therefore is said to be tri-stated, i.e. in a high impedance state, floating, disconnected. When the input pattern is driven onto the column lines, some or all of the transistors will be turned on. In the case where all of column lines 114 are intact, each transistor 202 will be turned on. Consequently, the potential appearing at node 130 will be (Vdd—Vth), where Vth is the threshold voltage of the transistors and assuming that a logic one is Vdd. On the other hand, where one or more of column lines 114 is an open, then the corresponding transistor 202 will be non-conductive, and thus node 130 will remain tri-stated. Thus, by monitoring node 130 for a change from its initial tri-state condition to a non-tri-stated condition, an indication is given that there is continuity among all of the column lines.

A continuity test of row lines 112 is accomplished in the same way as for column line 114. First, a pattern of ones is serially shifted into row register 102 via test input 138. Each of the bits in the pattern are simultaneously driven onto the row lines 112, thus transferring the pattern into row test register 122. If all the row lines are intact, then node 130 will change from a tri-sated condition to having a potential of (Vdd—Vth), again assuming logic ones are at a potential of Vdd. If any of the row lines has an open, node 130 will remain in its initial tri-stated condition.

Although a continuity test is adequate for determining whether any column or row line is compromised, the test provides no information as to which of the lines are open. Moreover, the test does not detect the presence of shorted lines. A more comprehensive test is provided by the register portion (flip-flop circuits 210) of test registers 122 and 124.

First, the column (row) register 104 (102) is serially loaded via test input 136 (138) with a bit pattern of alternating ones and zeroes. Next, the pattern is driven onto the column (row) lines and clocked into the flip-flop circuits of the column (row) test register 124 (122). The bit pattern stored in the flip-flop circuits is then clocked out onto node 134 (132) one bit at a time. Faults in the column (row) lines can be determined by comparing the pattern that is read out of the registers against the input bit pattern. For example, since the input pattern is an alternation of ones and zeroes, a pair of shorted lines would produce two consecutive ones in the readout pattern.

More specific fault identification is possible by using an appropriate test pattern of bits. For example, each line (column or row) can be individually tested for an open or a short condition. Beginning with the line in the most significant bit position, the test pattern would consist of a one in the MSB position and zeroes in the other bit positions. The pattern is driven on the lines and received at the far end in the register bank of the test register (122 or 124). The pattern is shifted out of the register bank and examined. If the MSB of the readout pattern is zero, then an open exists. If the readout pattern contains a one in other bit positions, then shorts exist. The next line is tested by shifting the bit to the next position in the test pattern and repeating the above steps.

Figure 7:
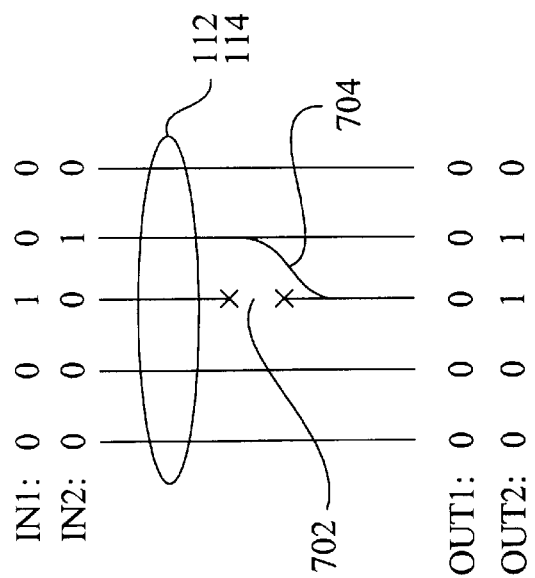
FIG. 7 shows a detection of a fault in accordance with the present invention.

As can be seen the above examples, various fault conditions can be deduced by applying the appropriate bit pattern, clocking it into the test register, and reading out the pattern from the test register. As a final example, consider FIG. 7 which shows a set of column or row lines 124 or 122. One of the lines exhibits an open 702, while an adjacent line shows a short 704 to the open line, the short being downstream of the open. Applying input test pattern IN1 to the column or row register 104 or 102 will produce output pattern OUT1 at the corresponding test register. Notice that the open prevents the logic one in test pattern IN1 from appearing in output pattern OUT1. Next, a second test pattern IN2 is applied. The output is output pattern OUT2. As can be seen, the output shows two ones and by comparing OUT1 with OUT2, a conclusion can be made as to the nature of the fault. This example therefore shows that the application of multiple input patterns and the analysis of the output patterns may be required in order to detect certain faults.

What is claimed is:

1. In a circuit having a plurality of signal lines, a method for testing the electrical integrity of said signal lines, the method comprising:
   applying a first voltage potential to a first end of each signal line;
   in a chain of series-connected transistors, biasing each transistor thereof with the potential at a second end of each signal line, said chain of transistors having a first end terminal and a second end terminal, said second end terminal capable of being in a high-impedance state or a conductive state;
   applying a second voltage potential to said first end terminal of said chain of transistors; and
   detecting a potential at said second end terminal of said chain of transistors;
   whereby an open in one of said signal lines is indicated by said second end terminal being in a high-impedance state, and the absence of an open in any of said signal lines is indicated by said second end terminal having a potential between ground potential and said second voltage potential.

2. The method of claim 1 further including:
   applying a test pattern to said first ends of said signal lines, said test pattern consisting of a combination of logic one's and logic zero's;
   transferring said test pattern into a register, said register disposed at second ends of said signal lines;
   reading out the contents of said register; and
   comparing the contents of said register against said test pattern;
   whereby electrical shorts and electrical opens among said signal lines are indicated by differences between the contents of said register and said test pattern.

3. The method of claim 2 wherein said test pattern comprises alternating one's and zero's whereby an electrical short between two immediate, neighboring lines is indicated by two consecutive ones in the readout pattern.

4. The method of claim 1 wherein said first potential is greater than any of a plurality of threshold voltages of said transistors.

5. The method of claim 1 wherein said circuit is a video memory device and said signal lines are word select lines and wherein said step of applying a first voltage includes simultaneously activating all of the word select lines in order to transfer said first voltage to said gate terminals of said chain of transistors.

6. In a memory circuit having a matrix of data lines and word lines, a method of testing the electrical integrity of said data lines and said word lines comprising:
   driving a first test pattern onto said data lines at a first end thereof;
   storing data signals appearing at a second end of said data lines into a first register;
   comparing said first test pattern against data latched into said first register;
   driving a second test pattern onto said word lines at a first end thereof;
   storing data signals appearing at a second end of said word lines into a second register; and
   comparing said second test pattern against data latched into said second register.

7. The method of claim 6 further including driving each gate terminal of a series-connected chain of transistors with the voltage potential present at a second end of one of said data lines, applying a voltage at a first end terminal of said chain of transistors and measuring the voltage potential at a second terminal of said chain of transistors.

8. The method of claim 7 further including driving each gate terminal of a second series-connected chain of transistors with the voltage potential present at a second end of one of said word select lines, applying a voltage at a first end terminal of said second chain of transistors and measuring the voltage potential at a second terminal of said second chain of transistors.

9. The method of claim 6 wherein said first and second test patterns comprise alternating logic one's and logic zero's.

10. A memory circuit comprising:
    a plurality of storage elements arranged in row and column fashion;
    a column data register having a plurality of outputs coupled to data lines, each data line coupled to a column of said storage elements;
    a word selector having a plurality of word select lines, each word select line coupled to a row of said storage elements, each word line having an end distal to said word selector, said word selector being operative to activate any one of said word select lines and further being operative to activate all of said word select lines; and
    a series-connected chain of transistors, each having a gate terminal coupled to a distal end of one of said word lines, said chain of transistors having a first end being coupled to a power rail.

11. The memory circuit of claim 10 wherein said transistors are N-channel devices.

12. The memory circuit of claim 10 wherein said word selector includes first circuitry to activate a selected word line, said word selector further including a row data register for receiving a bit pattern and second circuitry for selectively driving said word lines with outputs of said register.

13. The memory circuit of claim 12 further including a row test register having inputs coupled to said distal ends of said word select lines.

14. The memory circuit of claim 10 wherein each data line has an end distal to said column data register, the memory circuit further including a second series-connected chain of transistors, each having a gate terminal coupled to a distal end of one of said data lines, a first end of said chain of transistors being coupled to a first potential.

15. The memory circuit of claim 14 further including a column test register having inputs coupled to said distal ends of said data lines.

16. The memory circuit of claim 14 wherein said transistors of said second chain of transistors are N-channel devices.

17. A test circuitry in a video memory circuit that has a plurality of video storage elements arranged in a matrix form, a plurality of data lines and row select lines coupled to said storage elements, said test circuitry comprising:

a column data register for receiving a test pattern, said column data register having as many bit positions as there are data lines;

a column test register for receiving said test pattern from said column data register via said data lines, said column test register having as many inputs as there are said data lines, said data lines coupling said column test register and said column data register;

a row data register for receiving a test pattern, said row data register having as many bit positions as there are row select lines; and a row test register for receiving said test pattern from said row data register via said row select lines, said row test register having as many inputs as there are said row select lines, said row select lines coupling said row test register and said row data register;

wherein said column test register and row test register being capable of shifting out their content bits in series.

18. The test circuitry of claim 17 further including: a first series-connected chain of transistors, each having a gate terminal coupled to one of said data lines; and a second series-connected chain of transistors, each having a gate terminal coupled to one of said row select lines.

19. The test circuitry of claim 18 wherein each of said first and second chain of transistors includes an end terminal coupled to a power rail.

20. The test circuitry of claim 18 wherein each of said transistors is an N-channel device.

\* \* \* \* \*